(12) United States Patent
Wiegand (10) Patent No.: US 6,185,248 B1
(45) Date of Patent: Feb. 6, 2001

(54) WIDEBAND DIGITAL MICROWAVE RECEIVER

(75) Inventor: Richard J. Wiegand, Millersville, MD (US)

(73) Assignee: Northrop Grumman Corporation

( * ) Notice: Under 35 U.S.C. 154(b), the term of this patent shall be extended for 0 days.

(21) Appl. No.: 09/041,216

(22) Filed: Mar. 12, 1998

(51) Int. Cl.[7] .............. H04L 5/16; H03K 7/06; H03D 9/00
(52) U.S. Cl. .................. 375/222; 375/271; 329/322
(58) Field of Search ................... 375/322, 324, 375/377, 271, 275, 316; 329/306, 322, 349

(56) References Cited

U.S. PATENT DOCUMENTS

| | | | |
|---|---|---|---|
| 5,197,085 | * | 3/1993 | Luff ........................................ 375/334 |
| 5,454,007 | * | 9/1995 | Dutta ...................................... 375/322 |
| 5,770,977 | * | 6/1998 | Uurtamo ................................ 331/40 |
| 5,960,045 | * | 9/1999 | DuPonteil et al. .................... 375/324 |
| 6,005,506 | * | 12/1999 | Bazarjani et al. .................... 341/143 |

* cited by examiner

Primary Examiner—Chi H. Pham
Assistant Examiner—Khai Tran (57) ABSTRACT

A wideband digital microwave receiver includes a plurality of channels. Each channel includes an I sub-channel and a Q-sub-channel. Each channel also has a comb generator. Each sub-channel has a mixer for multiplying the signal from the comb generator and an input to that sub-channel. By offsetting the combs used in the channels, the true solution may be selected from a number of false solutions. This may be achieved by cross-multiplying outputs from the I sub-channels and cross-multiplying outputs from the Q sub-channels. The signal information may be stored in a buffer and pre-processed. The single true solution is output to a digital signal processor and/or a monitoring unit.

25 Claims, 6 Drawing Sheets

FIG.7b

WIDEBAND DIGITAL MICROWAVE RECEIVER

BACKGROUND OF THE INVENTION

1. Field of the Invention

The present invention is directed to a receiver, specifically a digital microwave receiver (DMR) with improved spectral dynamic range and reception instantaneous bandwidth.

2. Description of Related Art

Most tracking radar systems not intended for space applications operate in the range of 2 GHz to 20 GHz, although search radars often operate in lower bands, and have an instantaneous bandwidth (IBW) on the order of 1 to 10 MHz. Electronic Warfare (EW) receivers need to rapidly acquire such radar signals, so a narrow band IBW tuneable superheterodyne detector is not appropriate by itself.

EW receivers with wide IBW's have been employed, such as crystal video receivers and digital instantaneous frequency measurement (IFM) receivers. However, the signal environment is quite complex, especially if viewed over a wide band, and includes low, medium and high duty cycle signals. The present wide band EW receivers cannot accurately provide information when pulse signals are simultaneously present, especially for the weaker of the simultaneous signals. Simultaneous signals cause the sensor to be blinded or generate false data.

To achieve the requirement for both fine selectivity and wide reception, the use of many channels, each with a high sensitivity detector, is advocated. But, even if a large number of channels is proven practical, the subsequent processing of the received signals will be overwhelmed with data.

The economic impact of having many channels is presently minimized by employing parallel receiver hardware, employing a variety of receiver types and multiplexing receivers across the band.

SUMMARY OF THE PRESENT INVENTION

Therefore, it is an object of the present invention to provide an economical solution to the many channel problem. It is further an object to provide a receiver which can capture all signals in very wide instantaneous bandwidth, can handle simultaneous signals and has good sensitivity.

It is further an object to provide a receiver having a narrow selectivity IBW, a very wide reception IBW and a compatible data interface with the digital signal processor (DSP).

Further scope of applicability of the present invention will become apparent from the detailed description given hereinafter. However, it should be understood that the specific examples in the detailed description, indicating preferred embodiments of the invention, are given by way of illustration only, since various changes and modifications within the spirit and scope of the invention will become apparent to those of skill in the art from this detailed description.

BRIEF DESCRIPTION OF THE DRAWINGS

The present invention will become more fully understood from the detailed description given hereinbelow in the accompanying drawings which are given by way of illustration only, and thus are not limitative of the present invention and wherein:

FIG. 5b is a schematic of an integrator used with the filter shown in FIG. 5a;

DETAILED DESCRIPTION OF THE PREFERRED EMBODIMENT

Figure 1:
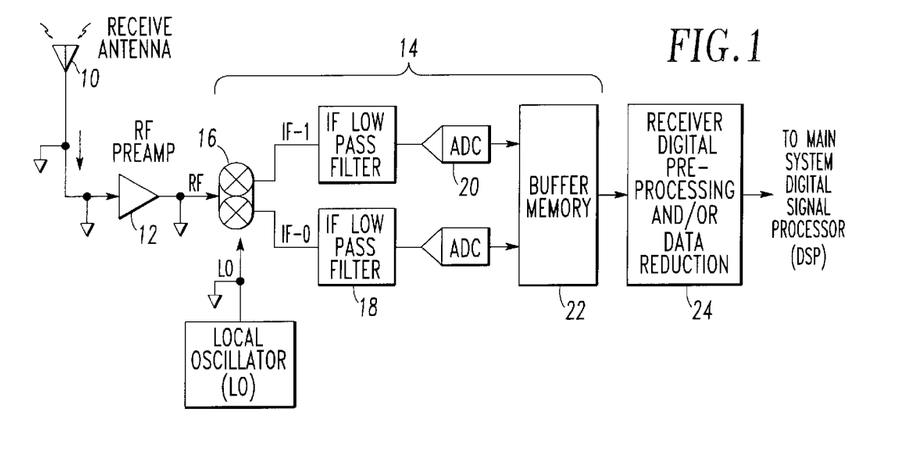
FIG. 1 is a schematic diagram of a potential implementation of a DMR.

Although the DMR concept does not have a standard design, FIG. 1 shows a potential implementation of a DMR. A signal from a receive antenna 10 is passed through a linear radio frequency preamplifier 12, to increase the amplitude and set the noise figure, and then passed to the DMR 14. The signal is beat down with mixers 16 with a local oscillator (LO) signal to a homodyne intermediate frequency (IF). The IF is passed through an IF low pass filter 18 and sampled with a high performance analog to digital converter (ADC) 20. A high performance ADC is defined with reference to the combination of sampling rate and resolution. For EW purposes, high performance would be 8 to 14 bits resolution with sampling rates in the hundreds of MHz.

The data is then buffered by a buffer memory 22. After buffering the data, the general filtering function is achieved by using a transformation on the data, such as a fast Fourier transform (FFT), performed by a receiver processor 24. The processed signal is then sent to a main system digital signal processor (DSP).

To maximize the bandwidth most efficiently, the sampling is usually done in quadrature as shown in FIG. 1. These channels are known as the I and Q, or real and imaginary, channels, respectively. When homodyne and quadrature sampling is used, as shown in FIG. 1, the RF local oscillator (LO) frequency equals the center of the reception IBW.

The DMR has many advantages over the previous analog RF microwave receiver approaches, including flexibility, digital signal processing interface compatibility and cost. Further, if the buffer memory 22 is large enough, the data can be examined again if the original FFT parameters prove inappropriate. A high-sensitivity, high-selectivity look can be made subsequent to a wideband lower sensitivity look on the original captured data. In electronic warfare applications, a jammer transmits not much more than 90% of the time so that the signal environment can be intercepted. The DMR buffer 22 capability makes the DMR the most compatible with a jammer look-through program since the signal processing can continue during this down time, operating on the data captured during the previous "look" time.

The present invention is directed to operating a small number of multiple DMR's in parallel channels, with joint processing of the data stream. Such a configuration gives an increase in the reception of the IBW, e.g., 1:1 for one channel, 10:1 for two channels and 100:1 for three channels, with respect to the sampling rate.

Figure 2:
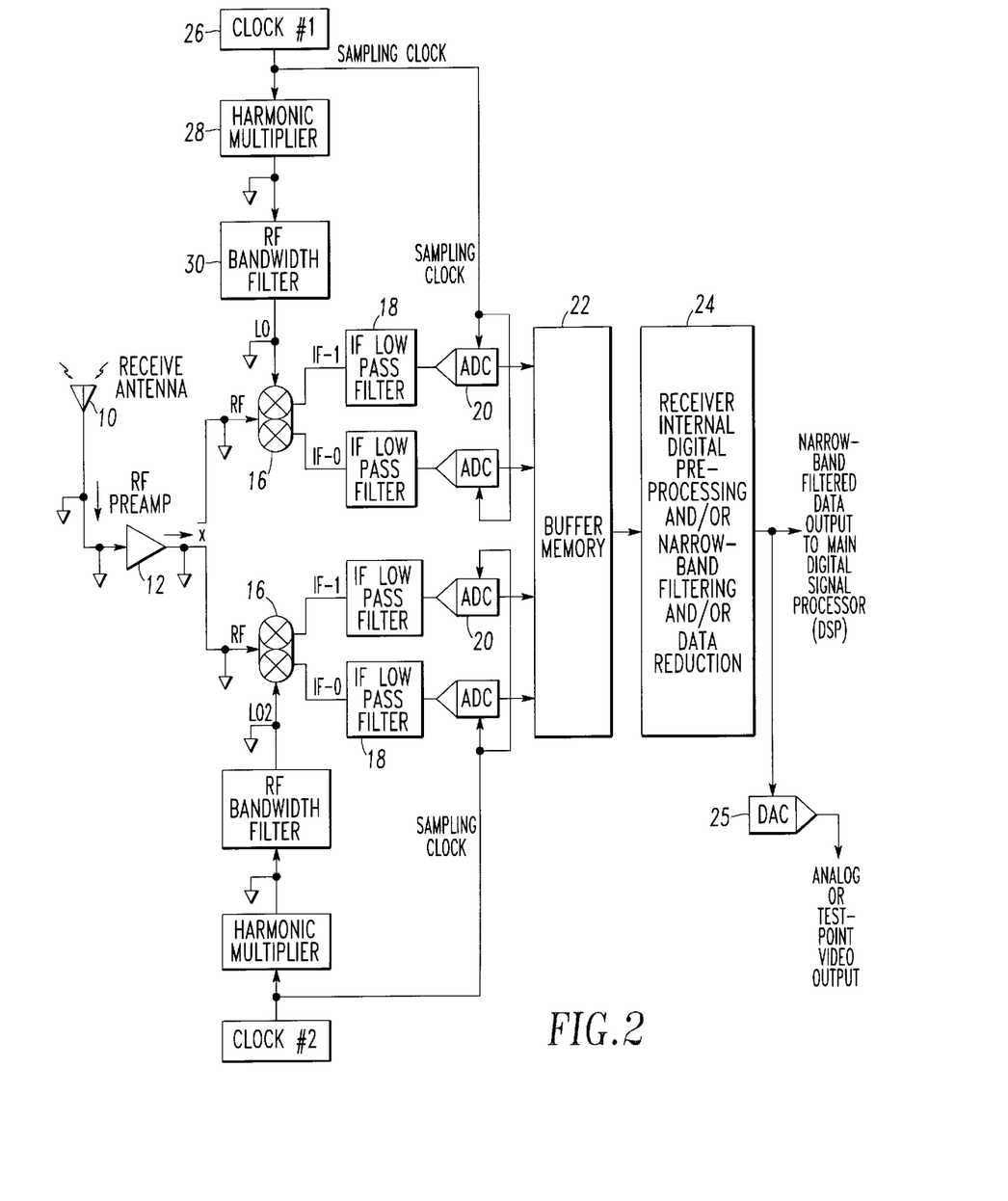
FIG. 2 is a schematic diagram of a wideband DMR in accordance with the present invention.
Figure 4:
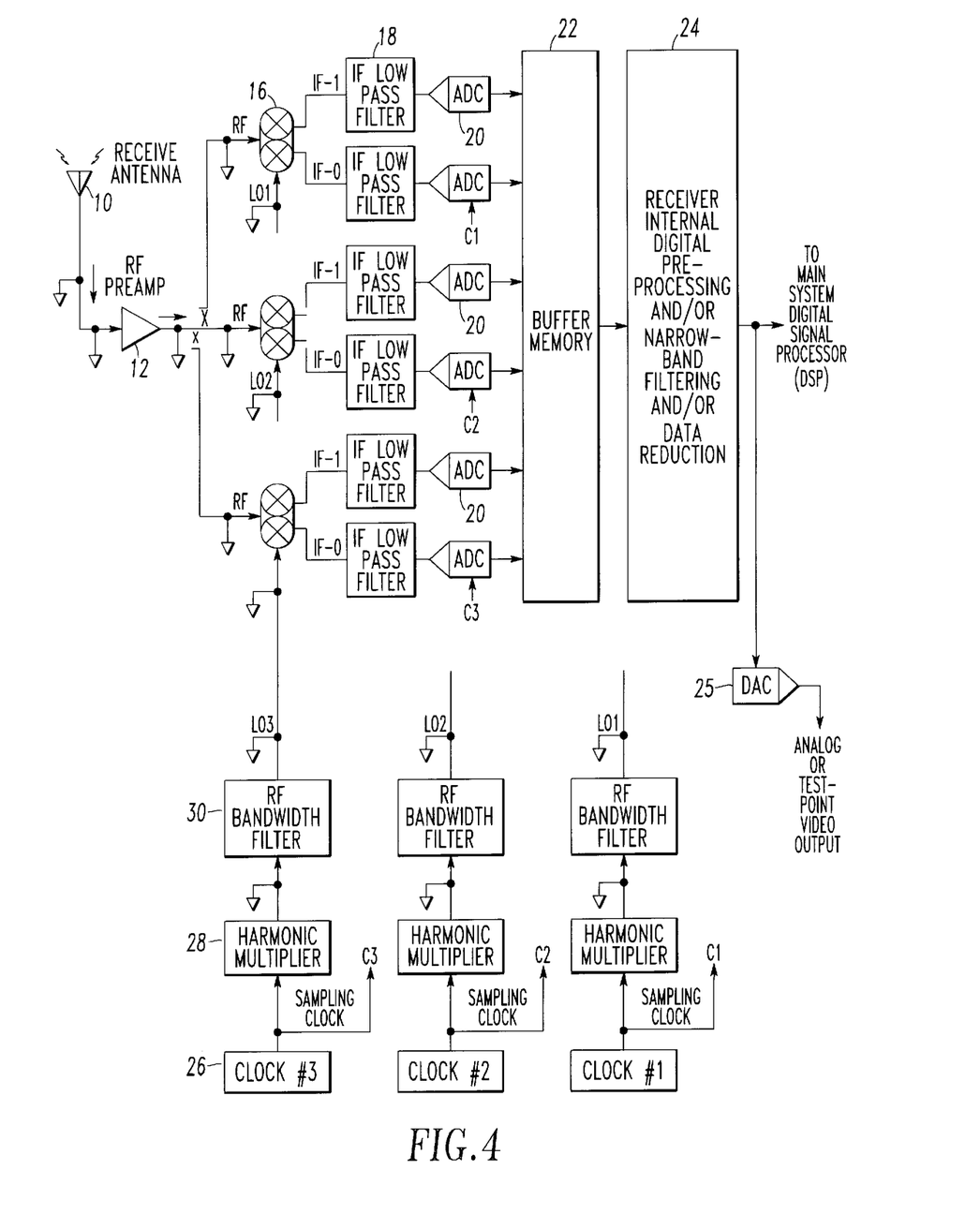
FIG. 4 is a schematic diagram of a very wide band DMR in accordance with the present invention.

FIG. 2 shows such a wideband DMR, implemented as a two channel system. FIG. 4 shows a very wideband DMR implemented as a three channel system. In these configurations, the multiple DMRs operating in parallel will be referred to as reception channels, the I and Q quadrature sampling channels will be referred to as sub-channels, and the digital processing that measures RF power within a given bandwidth will be referred to as equivalent filter channels.

Each reception channel showed in FIGS. 2 and 4 has the same basic quadrature sampling, data buffer and much of the narrow band power measurement filter channel data digital processing as the design of FIG. 1. Each configuration in FIGS. 2 and 4 also may include a digital-to-analog converter (DAC) 25 for monitoring the receiver output data stream.

Each reception channel also includes its own sampling clock 26, harmonic multiplier 28, and RF bandwidth filter 30. These additional elements serve as a comb generator for the LO signal for each reception channel, by passing the clock frequency from the clock 26 through the harmonic multiplier 28. Slight differences in amplitude of the individual comb lines are not a problem, since the LO signal is intended to saturate the mixer 16. The range of the LO combs sets the reception IBW.

Besides the joint processing of data, there are three significant differences between the configurations in FIG. 2 and 4 and that in FIG. 1. First, each reception channel RF LO consist of a series of equal amplitude equally spaced spectral tones over the RF band. Second, all the LO tones are precise multiples of the sampling clock, with the LO tone separation equal to the sampling rate. Finally, each reception channel has a distinctive sampling clock rate, i.e., the sampling clock rate of a reception channel is not equal to that of another reception channel. The sampling clock rates must be chosen carefully to maximize the reception IBW, to maximize the filter channel IBW and to minimize any spurious responses.

The Table below compares eleven different sample design options as numbered in the first column, showing hardware and performance relationships. Specifically, the second column shows the number of ADCs required, while the sixth and seventh columns reveal the impact on the digital hardware. The third and fourth columns indicated the clock sampling rates.

The first option in the Table does not employ quadrature sampling. The second option corresponds to FIG. 1 and is the primary reference for comparison purposes. Options 3 through 7 correspond to a configuration shown in FIG. 2, while options 8 through 11 are related to the configurations shown in FIG. 4, as indicated in the eighth column.

While the configurations of the present invention may involve increase mathematical operations as seen in this Table, as shown in the sixth and seventh columns, the cost per unit frequency is dramatically decreased. The fifth column shows the resulting normalized bandwidth.

TABLE

| DESIGN OPTION | # OF ADC | CLOCK #2 % | CLOCK #3 % | RF IBW MULT. | # OF DIGI-TAL × | # OF DIGI-TAL + | FIG. |
|---|---|---|---|---|---|---|---|
| 1 | 1 | X | X | 0.5 | 3 | 1 | 1 |
| 2 | 2 | X | X | 1 | 8 | 3 | 1 |
| 3 | 4 | 90 | X | 10 | 14 | 5 | 2 |
| 4 | 4 | 95 | X | 20 | 20 | 5 | 2 |
| 5 | 4 | 90 | X | 10 | 22 | 9 | 2 |
| 6 | 4 | 80 | X | 5 | 14 | 5 | 2 |
| 7 | 4 | 80 | X | 5 | 22 | 9 | 2 |
| 8 | 6 | 90 | 99 | 100 | 22 | 7 | 4 |
| 9 | 6 | 90 | 99 | 100 | 34 | 13 | 4 |
| 10 | 6 | 80 | 96 | 25 | 22 | 7 | 4 |
| 11 | 6 | 80 | 96 | 25 | 34 | 13 | 4 |

Figure 3:
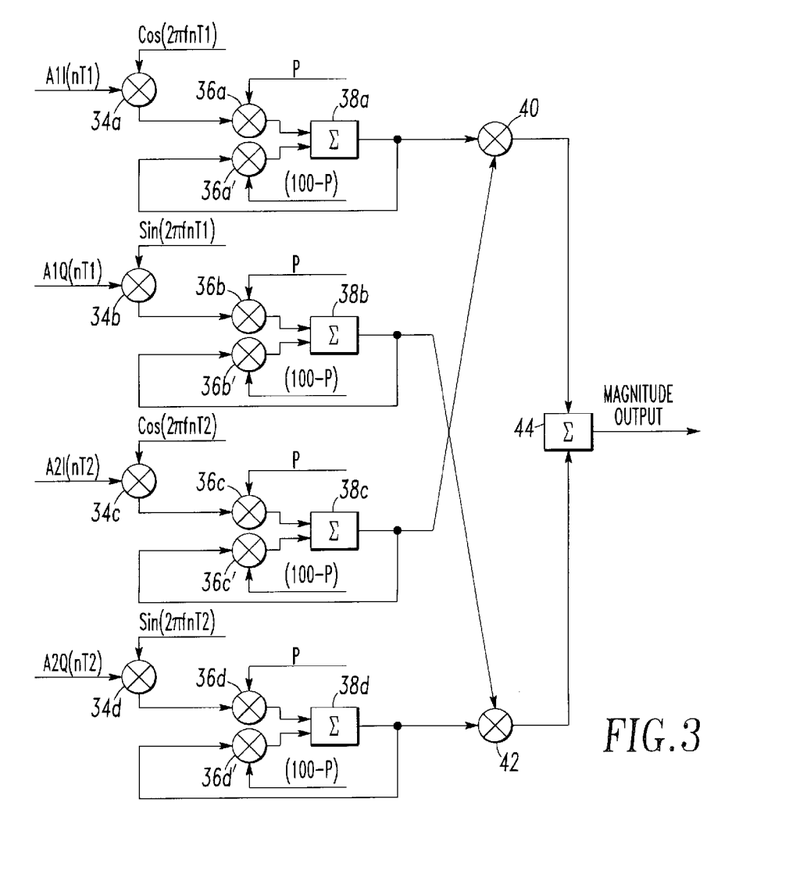
FIG. 3 is a schematic diagram of a two-channel digital filter for use with the DMR shown in FIG. 2.
Figure 5A:
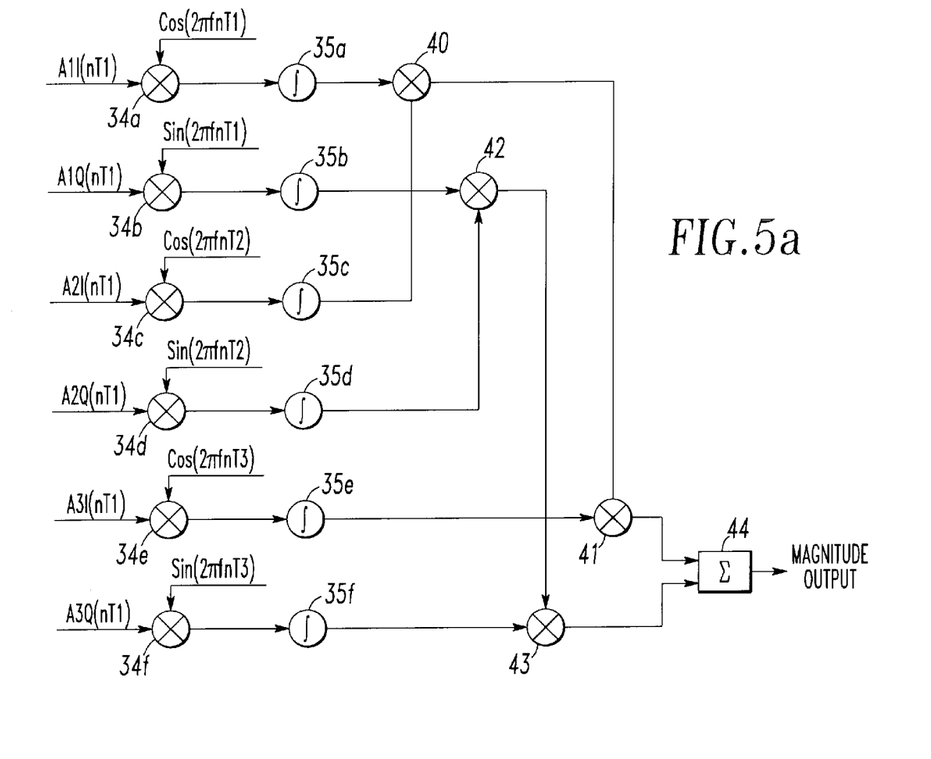
FIG. 5a is a schematic diagram of a three-channel digital filter for use with the DMR shown in FIG. 4.
Figure 5B:
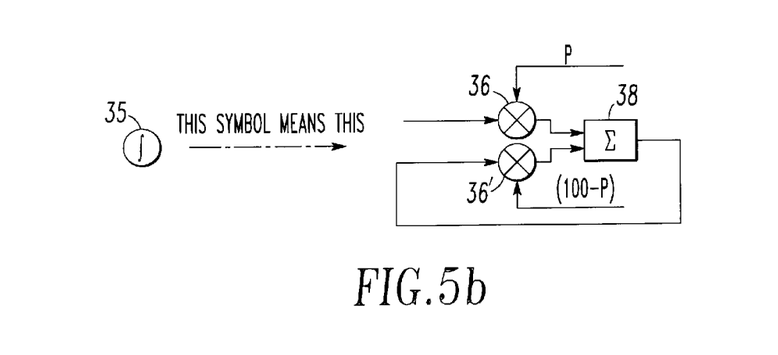

While it is usually advisable in digital designs to have all the hardware operating in synchronism to one common clock, by combining the outputs of the different channels at the points shown in FIGS. 3 and 5, after filtering where the data does not change as rapidly as the clock rate, buffering and combining the asynchronous signals should not be a problem. By using different clock signals, the LO, and thus the IF, signals will be different for each channel.

The clock rate should be selected to optimize the combination of cost, reception bandwidth, minimum pulse width and spectral dynamic range. For example. for a two channel DMR, the clock rate difference should be greater than the maximum filter channel signal measurement IBW.

Every input signal, even if simultaneously present with multiple larger signals, will be converted down to the IF. A conversion to an acceptable IF occurs because the signals beat with the closest LO comb line. This is due to the fact that the separation between the input carrier and closest LO comb line must be less than the IF bandwidth. The ADC 20 then converts the signal to a digital form.

The details of the digital filter 24 shown in FIGS. 3 and 5 illustrate only simple filter channels, as opposed to full FFT's; however they have a programmable center and a programmable IBW. There will be no spurious output unless the filter channel IBW is programmed to be too wide. However, if any one signal, or the combined results of all the signals cause the RF preamplifier or the ADC to saturate, then these linearity based superposition rules no longer completely apply, i.e. the spectral dynamic range will have been exceeded.

As shown in FIGS. 3 and 5, the filter channel function is achieved by a set of multipliers and adds jointly applied to the reception channel quadrature sub-channel data. This is only one version of the pre-processing. This digital processing can be done in real time using digital IC chips. This processing can also be done repeatedly for data held in the buffer, for different program combinations of filter center frequency and IBW.

In FIGS. 3 and 5, Am is the channel amplitude of the mth channel, I and Q are the quadrature sub-channels, P is a percentage constant that sets the filter time constant, Tm is the channel sampling period of the mth channel, f is a processing narrow filter center frequency out of the complete RF range, and n is an integer time counter. The programmable constant P is st to match the input pulse width expected for that channel.

The multipliers 34a–34d beat the input from the I and Q sub-channels of each channel with the sine and cosine, respectively, of the product of the filter center frequency and the channel sampling period. Each input is unique and based on the input amplitude and the channel sampling period.

The multipliers 36a–36d multiply the output from the multipliers 34a–34d, respectively, by P, while the multipliers 36a'–36d' multiply the output from the adders 38a–38d, respectively, by (100-P). The accumulator summation length from having many data sampled and added together then sets the filter channel IBW. The output of the multipliers 36a–36d and 36a'–36d' are added together by adders 38a–38d, respectively. The output of the adder 38a–38d is then fed back to the multiplier 36a'–36d', respectively.

The outputs from the adders 38a, 38c, i.e., from the I sub-channels for each channel, are supplied to a multiplier 40. The outputs from the adders 38b, 38d, i.e., from the Q sub-channels for each channel, are supplied to another multiplier 42. The two reception channels are thus asynchronously multiplied in a dot-product vector fashion.

For the three channel configuration shown in FIG. 5a, an additional set of multipliers 41, 43 is needed. Multiplier 41 receives the output from the multiplier 40 and the output from an integrator 35e, another I sub-channel. Similarly, the multiplier 43 receives the output from the multiplier 42 and the output from an integrator 35f, another Q sub-channel. As shown in FIG. 5b, the integrators 35a–35f have the same structure as in FIG. 3, but have been abbreviated to simplify the diagram.

In both configurations shown in FIGS. 3 and 5, the dot-products of the I sub-channels and the Q sub-channels are then added by accumulator adder 44 to output the signal amplitude or magnitude as a function of time.

The closer the sampling clock rates of the reception channels are chosen to be, the wider the reception bandwidth is. The reception bandwidth means the bandwidth over which there are not equal power aliasing spectral lines. The processing result from each reception channel is dirty, i.e. contains equal power aliasing spurs, but the joint processing output is clean. However, the closer the channel sampling rates, the longer the integration time needed to suppress certain aliasing terms. Therefore, the closer the channel sampling rates are to one another, the higher the spurs for a given filtering IBW, i.e., for a given minimum pulse. The integration time should be roughly the reciprocal of the filter channel IBW and cannot be longer than the expected pulse width. The integration is accomplished in hardware by the accumulators.

The present invention is intended for use where the sampling rate exceeds the IBW of any one signal. Simple digital integrators are used to measure the power at a given frequency by beating the spectrum with a fictitious signal representing a unit sinusoid at the desired center frequency. The reciprocal of this integration time of this accumulator represents the filter IBW. This output from each individual reception channel will be dirty because of all the frequency folds; thus the sampled data has redundant solutions that can be matched to this data.

Figure 6A:
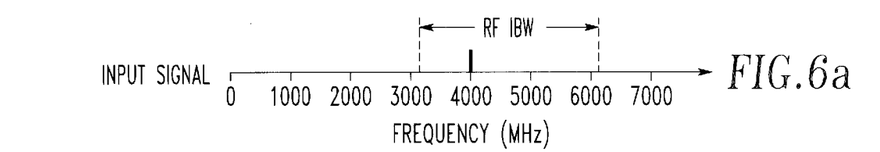
FIGS. 6a–6h illustrate a spectrum example.
Figure 6B:
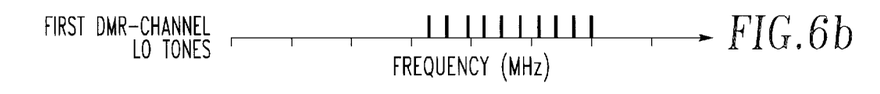
Figure 6C:
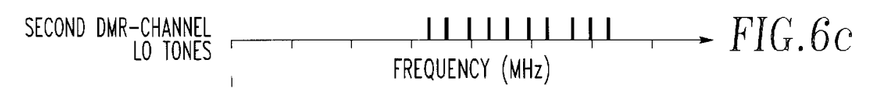
Figure 6D:
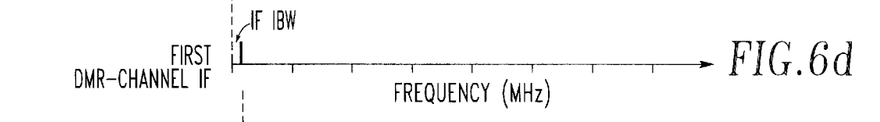
Figure 6E:
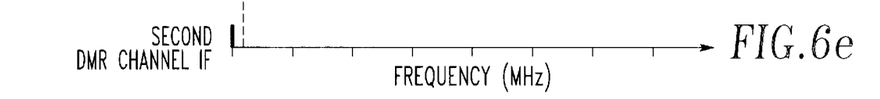

This can be seen, for example, in the spectrum illustration shown in FIGS. 6(a)–6(h), which corresponds to option 5 in the Table. FIG. 6(a) illustrates the input signal and the RF IBW. FIGS. 6(b) and 6(c) illustrate the first and second DMR channel LO tones, respectively. FIGS. 6(d) and 6(e) illustrate the first and second DMR channel IF, respectively. As can be seen, these are different for the different channels.

Figure 6F:
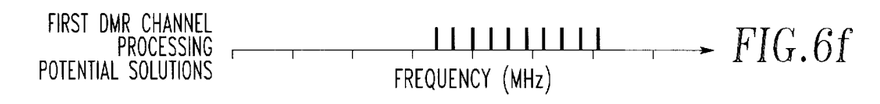
Figure 6G:
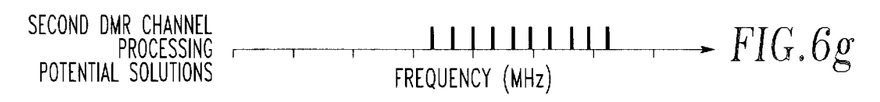
Figure 6H:
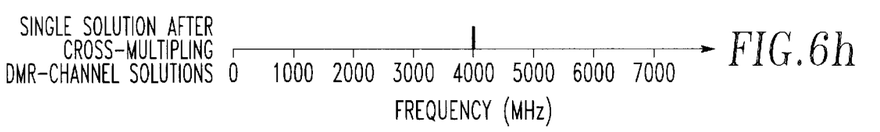

FIGS. 6(f) and 6(g) illustrate the first and second DMR channel processing potential solutions. Each of these solutions is called an aliasing spectral line. FIG. 6(h) illustrates the single solution output after the first and second DMR channel solutions were cross-multiplied. Since the same signal created the data in both reception channels, of all of the spectral lines, i.e. potential solutions, only one set exactly agrees in amplitude and frequency. This set must therefore represent the true signal.

The processing for determining the single solution is the digital processing conducted by the configurations shown in FIGS. 3 and 5 in real time using the multipliers and adders. The sampling clock rates in both channels are specifically chosen so that all false aliasing lines do not match on an inter-reception-channel basis. The true solution frequency depends only on the input frequency, while the false solution frequencies depend on the input frequency, the LO comb line frequencies and the sampling clock rate. Therefore, these false solution frequencies can be eliminated.

Figure 7A:
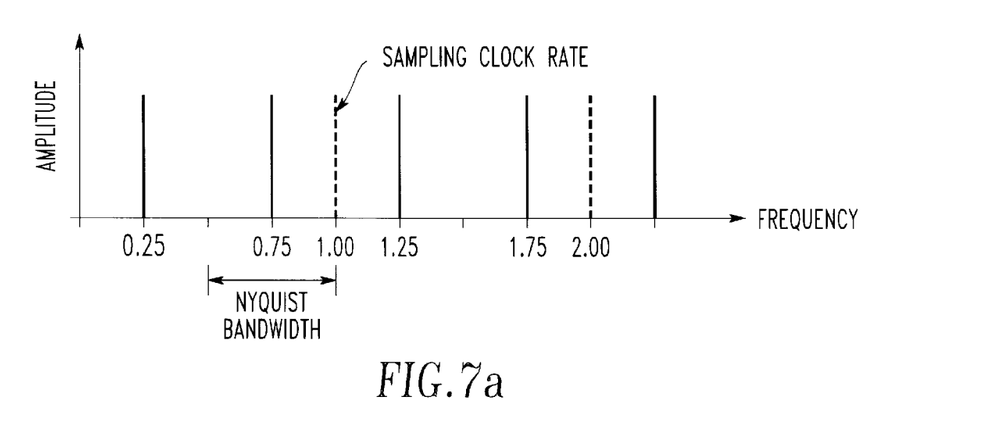
FIG. 7a illustrates frequency domain analysis of aliasing.
Figure 7B:
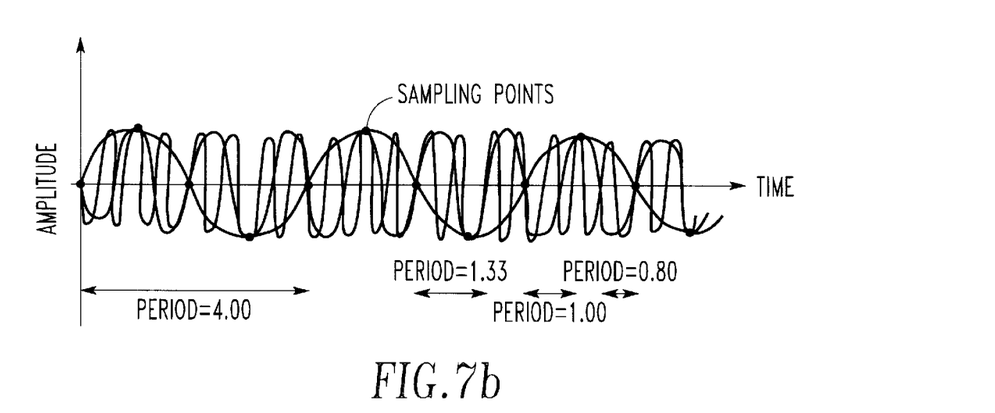
FIG. 7b illustrates time domain analysis of aliasing.

The redundant solutions concept is shown graphically in the frequency domain in FIG. 7(a) and in the time domain in FIG. 7(b). Only the three lowest frequencies in the frequency domain representation are shown in the time domain representation. Frequencies and times have been normalized to the sampling clock rate in FIGS. 7(a) and 7(b).

It can be seen that several sinusoids pass through the set of data points in FIG. 7(b). This means that there are several potential solution for that data set. It is the object of the circuitry in FIG. 3 or FIG. 5 to select only the true solution form this set of potential solutions.

The invention being thus described, it will to obvious those of ordinary skill in the art that the same may be varied in many ways. Such variations are not to be regarded as the departure from the spirit and scope of the invention, and all such modifications as would be obvious to one skilled in the art are intended to be included within the scope of the following claims.

What is claimed is:

1. A wideband digital microwave receiver comprising:
   an input receiving a signal from a receive antenna;
   a plurality of channels, each channel including
      an I sub-channel,
      a Q sub-channel,
      a comb generator, and
      a mixer for each sub-channel, receiving an output of said comb generator and the signal from said input;
   means for filtering outputs from said channels for delivery to a digital signal processor; and
   wherein each of said sub-channels further includes an analog-to-digital converter before said means for filtering.

2. The receiver according to claim 1, wherein said comb generator includes a clock generator and a harmonic multiplier.

3. The receiver according to claim 2, wherein a clock rate of the clock generator is different for each of said plurality of channels.

4. The receiver according to claim 1, wherein said means for filtering includes means for selecting a single solution from a plurality of potential solutions.

5. The receiver according to claim 4, wherein means for selecting includes a multiplier for cross multiplying outputs from the I sub-channels for each of said plurality of channels and a multiplier for cross multiplying outputs from the Q sub-channel for each of said plurality of channels.

6. The receiver according to claim 1, further comprising a combiner which combines outputs from said plurality of channels, said combiner being located after said means for filtering.

7. The receiver according to claim 1, further comprising a buffer which stores signal information from said plurality of channels.

8. The receiver according to claim 1, wherein said sub-channels further include an intermediate frequency filter.

9. The receiver according to claim 3, wherein a difference between clock rates of different channels is greater than a maximum instantaneous bandwidth.

10. The receiver according to claim 1, further comprising a digital-to-analog converter receiving an output from said means for filtering and outputting an analog signal to be tested.

11. The receiver according to claim 1, wherein said means for filtering includes:
   a first multiplier for each sub-channel, which multiplies a sub-channel signal by a unit sinusoid at a desired frequency;
   means for selecting a constant which sets a filter channel instantaneous bandwidth based on the relationship of a sampling clock rate to a reciprocal therewith, a second multiplier for each sub-channel multiplying an output from said first multiplier and said constant;

means for averaging an output of said second multiplier for each sub-channel;

means for cross-multiplying average outputs for all I sub-channels;

means for cross-multiplying average outputs for all Q channels; and an adder for adding outputs from each means for cross-multiplying.

12. The receiver according to claim 1, wherein said plurality of sub-channels is two sub-channels.

13. The receiver according to claim 1, wherein said plurality of sub-channels is three sub-channels.

14. A method of receiving microwave inputs over a wideband comprising the steps of:

dividing a received signal into a plurality of channels;

dividing each channel into an I sub-channel and a Q sub-channel;

generating, for each channel, a comb signal;

mixing, for each sub-channel, said comb signal and said received signal;

filtering outputs from said channels for delivery to a digital signal processor; and prior to said filtering, analog filtering said received signal and sampling the filtered received signal with an analog-to-digital converter.

15. The method according to claim 14, wherein said generating step includes generating a clock signal and harmonically multiplying said clock signal.

16. The method according to claim 14, wherein said comb signal is different for each of said plurality of channels.

17. The method according to claim 14, wherein said filtering includes selecting a single solution from a plurality of potential solutions.

18. The method according to claim 17, wherein said selecting includes cross multiplying outputs from the I sub-channels for each of said plurality of channels and cross multiplying outputs from the Q sub-channel for each of said plurality of channels.

19. The method according to claim 14, further comprising combining, after said filtering, outputs from said plurality of channels.

20. The method according to claim 14, further comprising storing signal information from said plurality of channels.

21. The method according to claim 14, wherein said filtering includes:

first multiplying, for each sub-channel, a sub-channel signal by a unit sinusoid at a desired frequency;

selecting a constant which sets a filter channel instantaneous bandwidth based on the relationship of a sampling clock rate to the reciprocal therewith;

second multiplying, for each sub-channel, an output from said first multiplying and said constant;

averaging an output of said second multiplying for each sub-channel;

cross-multiplying average outputs for all I sub-channels;

cross-multiplying average outputs for all Q channels; and adding outputs from each cross-multiplying step.

22. A wideband digital microwave receiver comprising:

an input receiving a signal from a receive antenna;

a plurality of channels, each channel including
an I sub-channel,
a Q sub-channel,
a comb generator, and
a mixer for each sub-channel, receiving an output of said comb generator and the signal from said input;

means for filtering outputs from said channels for delivery to a digital signal processor, said means for filtering including means for selecting a single solution from a plurality of potential solutions; and wherein said means for selecting comprises a multiplier for cross multiplying outputs from the I sub-channels for each of said plurality of channels and a multiplier for cross multiplying outputs from the Q sub-channel for each of said plurality of channels.

23. The receiver according to claim 22, further comprising a combiner located after said means for filtering for combining outputs from said plurality of channels.

24. A method of receiving microwave inputs over a wideband comprising the steps of:

dividing a received signal into a plurality of channels;

dividing each channel into an I sub-channel and a Q sub-channel;

generating, for each channel, a comb signal;

mixing, for each sub-channel, said comb signal and said received signal; and filtering outputs from said channels for delivery to a digital signal processor, said filtering step including selecting a single solution from a plurality of potential solutions and;

wherein said selecting step includes cross multiplying outputs from the I sub-channels for each of said plurality of channels and cross multiplying outputs from the Q sub-channel for each of said plurality of channels.

25. The method according to claim 23 and further including the step of combining outputs from said plurality of channels after said filtering step.

* * * * *